(12) United States Patent
Hirose

(10) Patent No.: US 7,880,491 B2
(45) Date of Patent: Feb. 1, 2011

(54) MULTILAYER SEMICONDUCTOR DEVICE

(75) Inventor: Yukitoshi Hirose, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/264,301

(22) Filed: Nov. 4, 2008

(65) Prior Publication Data

US 2009/0065774 A1 Mar. 12, 2009

Related U.S. Application Data

(62) Division of application No. 11/254,703, filed on Oct. 21, 2005, now Pat. No. 7,466,158.

(30) Foreign Application Priority Data

Oct. 21, 2004 (JP) ............................. 2004-306357

(51) Int. Cl.
*G01R 31/26* (2006.01)
(52) U.S. Cl. ........................ 324/763; 324/765
(58) Field of Classification Search ................. None
See application file for complete search history.

(56) References Cited

U.S. PATENT DOCUMENTS

| 4,357,703 | A | 11/1982 | Van Brunt |
| 5,107,208 | A | 4/1992 | Lee |
| 5,208,841 | A | 5/1993 | Nakanishi |
| 5,251,179 | A | 10/1993 | Wittman |
| 5,581,176 | A * | 12/1996 | Lee .......................... 324/158.1 |
| 5,969,538 | A | 10/1999 | Whetsel |
| 5,986,460 | A * | 11/1999 | Kawakami .................. 324/765 |
| 6,298,001 | B1 | 10/2001 | Lee et al. |
| 6,621,260 | B2 | 9/2003 | Eldridge et al. |
| 6,798,049 | B1 | 9/2004 | Shin et al. |
| 6,882,171 | B2 | 4/2005 | Ong |
| 6,987,383 | B2 | 1/2006 | Kusumoto |
| 7,298,157 | B2 | 11/2007 | Kim |
| 2004/0145039 | A1* | 7/2004 | Shim et al. .................. 257/678 |
| 2004/0159954 | A1* | 8/2004 | Hetzel et al. ................ 257/777 |

FOREIGN PATENT DOCUMENTS

| JP | 11-212672 A | 8/1999 |
| JP | 11-274395 A | 10/1999 |
| JP | 2000-227457 A | 8/2000 |
| JP | 2000-332192 A | 11/2000 |
| JP | 2002-217367 A | 8/2002 |
| WO | 02/082540 A1 | 10/2002 |

* cited by examiner

*Primary Examiner*—Minh N Tang
(74) *Attorney, Agent, or Firm*—Sughrue Mion, PLLC

(57) ABSTRACT

The present invention is applied to a multilayer semiconductor device including a plurality of layered semiconductor chips. At least one of the plurality of layered semiconductor chips includes a pad that is not connected to any external circuit terminal of the multilayer semiconductor device. The multilayer semiconductor device also includes a separating element that connects the pad to a test stub line when each semiconductor chip is tested and separates the pad from the test stub line during the normal operation.

7 Claims, 6 Drawing Sheets

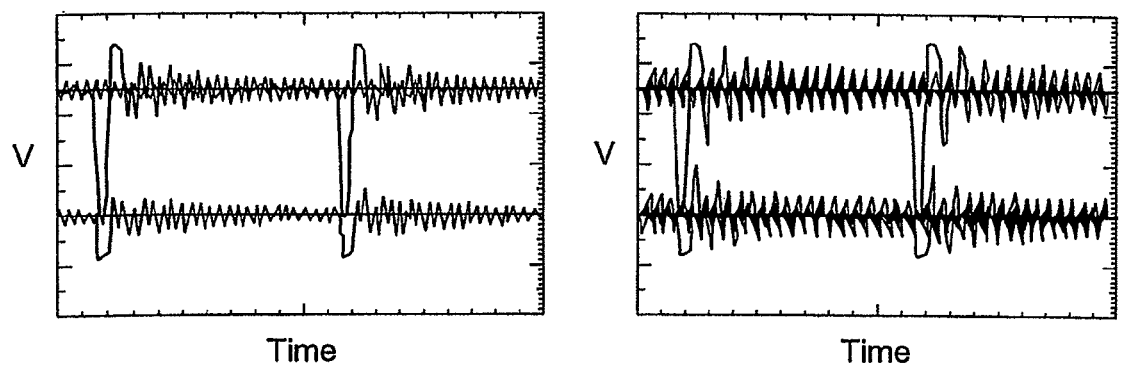
FIG. 3A
PRIOR ART
FIG. 3B
PRIOR ART
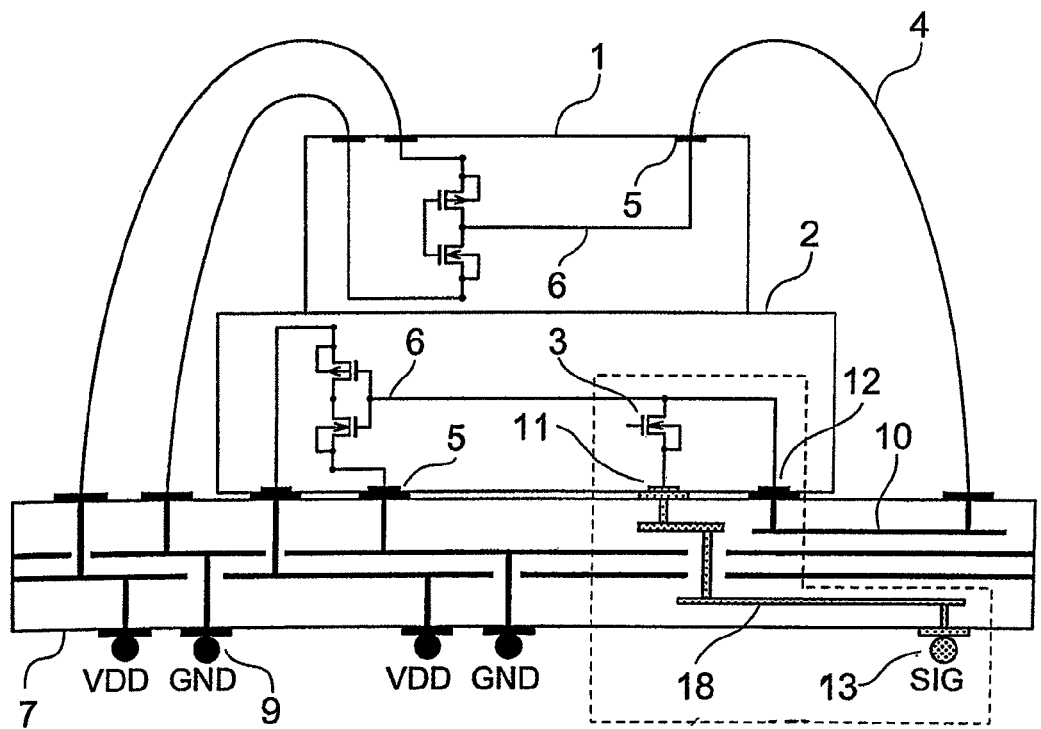
FIG. 4

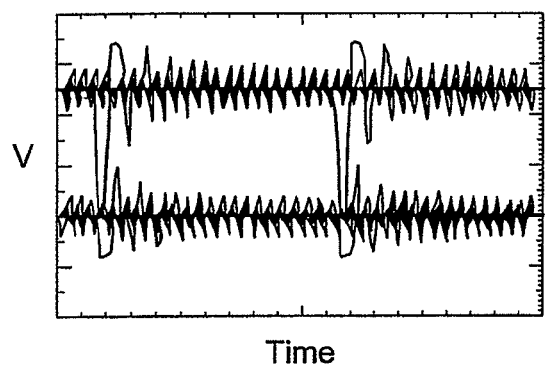
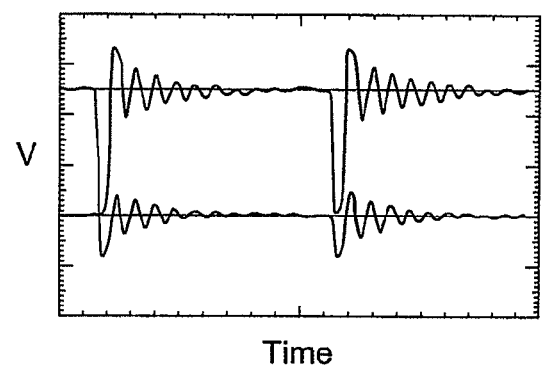
FIG. 5A          FIG. 5B
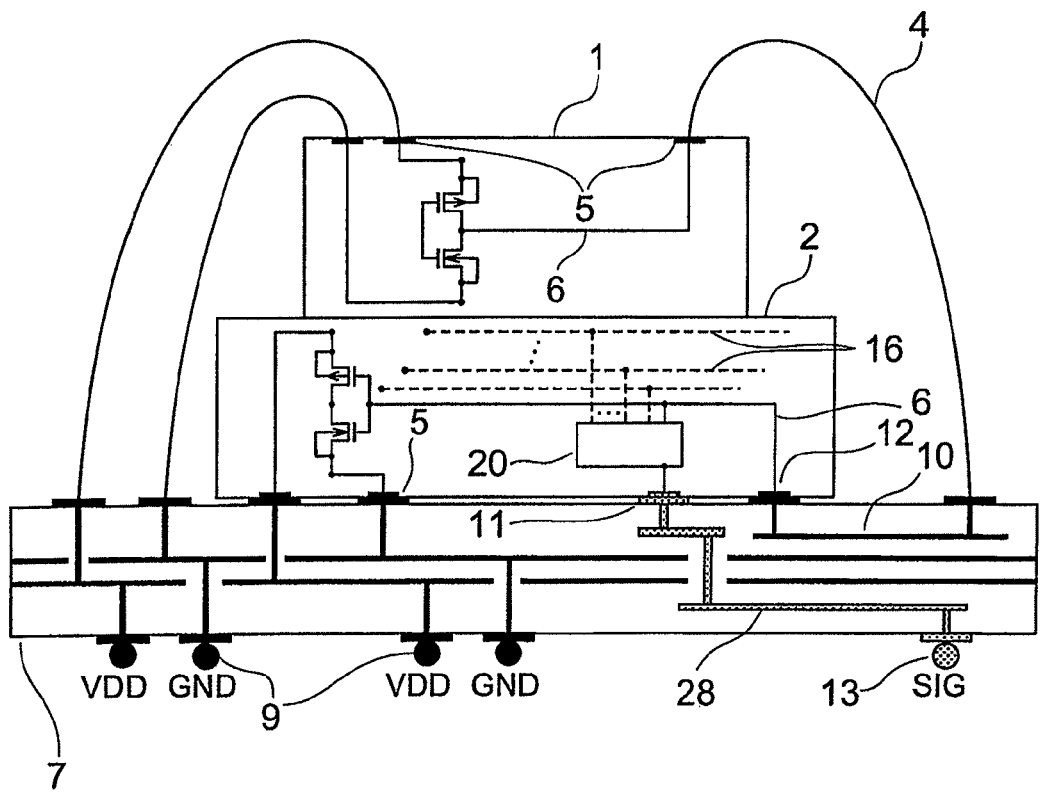
FIG. 6

MULTILAYER SEMICONDUCTOR DEVICE

This is a divisional of application Ser. No. 11/254,703 filed Oct. 21, 2005 now U.S. Pat. No. 7,466,158. The entire disclosure of the prior application, application Ser. No. 11/254,703 is hereby incorporated by reference.

This application claims priority to prior application JP 2004-306357, the disclosure of which is incorporated herein by reference.

BACKGROUND OF THE INVENTION

1. Field of the Invention

The present invention relates to a semiconductor device, and more specifically, it relates to a multilayer semiconductor device including a plurality of semiconductor chips.

2. Description of the Related Art

Recent electronic equipment needs to be high-performance, small, and lightweight. Therefore, semiconductor devices used for electronic equipment also need to be high-performance and small. In addition to the large-scale integration of semiconductor devices, downsizing of packages has progressed. For example, BGA (Ball Grid Array) and CSP (Chip Size Package) have been developed.

In conventional electronic equipment, as shown in FIG. 1, semiconductor devices 14 and 15, such as a CPU, a controller, a memory, or the like, are mounted on a printed board 16 and connected to each other with wirings on the printed board 16. When the semiconductor devices are arranged two-dimensionally as shown in FIG. 1, the area of the printed board needs to be large.

Recent digital information appliances need to be smaller and more lightweight, and have higher performance. In order to meet these requirements, various techniques for layering a plurality of semiconductor chips have been developed.

FIG. 2 shows a multilayer semiconductor device in which two kinds of semiconductor chips 1 and 2 are layered. When a plurality of chips are layered, the chips have two types of pads 5, that is, a pad having a circuit terminal of the multilayer semiconductor device, and a pad for connecting the chips to each other having no circuit terminal of the multilayer semiconductor device. That is, the latter pad is only used for data communication between the chips, and information is not output from the pad to the outside.

When the semiconductor devices 14 and 15 are mounted on the printed board 16 and connected to each other as shown in FIG. 1, the semiconductor devices 14 and 15 can be tested individually because they have individual terminals.

However, when a plurality of chips are layered on a printed board 7 and encapsulated in a package as shown in FIG. 2, a chip having no circuit terminal of the multilayer semiconductor device cannot be tested individually.

In order to test the layered chips individually, it is necessary to provide a test stub line 8 for connecting the pad having no terminal of the multilayer semiconductor device to a test signal pin 13 as shown in FIG. 2. Through the added test signal pin 13, the layered chips can be tested individually.

However, the test stub line 8 shown in FIG. 2 is used only during a test and is useless during the normal operation. During the normal operation in which signals are transmitted between the semiconductor chips 1 and 2, the test stub line 8 creates a new problem where ringing due to reflection distorts the signal waveform.

FIGS. 3A and 3B show simulation waveforms showing the influence of the test stub line. The simulation waveforms are waveforms in a main signal pad 12 (FIG. 2) when a random pattern is generated. FIG. 3A shows the case where the stub line is short. FIG. 3B shows the case where the stub line is long. As is clear from the simulation results, when the stub line is long, the signal quality is deteriorated. The higher the data speed of the device, the more serious the deterioration of the signal quality.

In addition, although the test stub line 8 shown in FIG. 2 is used only during a test and is useless during the normal operation, the test stub line 8 and the signal line are connected in one-to-one correspondence. This causes the number of pins of the multilayer semiconductor device to be larger. Consequently, the area of the multilayer semiconductor device increases, or the numbers of power source pins and ground pins allocated to the multilayer semiconductor device are reduced.

The following documents discuss the testing of layered chips.

Japanese Unexamined Patent Publication No. 2002-217367 discusses providing test terminals on the outer side of terminals of a semiconductor device. When the semiconductor device is in a wafer, tests are carried out through the test terminals. After the tests are completed, the test terminals are cut off.

Japanese Unexamined Patent Publication No. Tokkai Hei 11-274395 discusses a semiconductor device having a separating circuit. The separating circuit can switch between connection and disconnection between the inner circuit and pads of chips connected to a common terminal of the semiconductor device.

As described above, a multilayer semiconductor device in which a plurality of semiconductor chips are layered has pads of semiconductor chips that are not connected to any external terminals, and therefore the semiconductor chips cannot be tested individually.

In addition, in the case where a test stub line and a test signal pin are provided in order to test the semiconductor chips individually, the test stub line, which is not used during the normal operation, causes reflection and crosstalk and deteriorates the signal quality in the normal operation.

SUMMARY OF THE INVENTION

The present invention provides a multilayer semiconductor device having excellent signal quality. In the multilayer semiconductor device, a test stub line is separated from the main signal line during the normal operation.

The present invention is applied to a multilayer semiconductor device including a plurality of layered semiconductor chips.

According to a first aspect of the present invention, at least one of the plurality of layered semiconductor chips comprises a pad that is not connected to any external circuit terminal of the multilayer semiconductor device. The multilayer semiconductor device further comprises a separating element that connects the pad to a test stub line when each semiconductor chip is tested and separates the pad from the test stub line during the normal operation.

In the multilayer semiconductor device, it is preferable that the at least one of the plurality of layered semiconductor chips further comprises a test pad for connecting to the test stub line. In this case, the separating element is a switching transistor or a selector included in the at least one of the plurality of layered semiconductor chips.

In the multilayer semiconductor device, the separating element may be a switching transistor, a selector, or a fuse provided on a printed board on which the plurality of layered semiconductor chips are mounted.

In the multilayer semiconductor device, the selector selects one signal line from N signal lines in the plurality of layered semiconductor chips and connects the selected signal line to the test stub line.

According to a second aspect of the present invention, at least one of the plurality of layered semiconductor chips comprises a pad that is not connected to any external circuit terminal of the multilayer semiconductor device and has an insert hole which reaches the pad. A conductive member is inserted into the insert hole to connect the pad to an external measuring apparatus when each semiconductor chip is tested.

The conductive member may be a connector or a probe.

In the multilayer semiconductor device according to the first and second aspects, the plurality of layered semiconductor chips may comprise a through-electrode.

In the multilayer semiconductor device according to the first and second aspects, the plurality of layered semiconductor chips may be System-On-Chips having a plurality of functions.

In the multilayer semiconductor device according to the first and second aspects, the multilayer semiconductor device may comprise a plurality of layered semiconductor devices instead of the plurality of layered semiconductor chips.

BRIEF DESCRIPTION OF THE DRAWINGS

FIGS. 3A and 3B show simulation waveforms showing the influence of a test stub line in the conventional multilayer semiconductor device shown in FIG. 2;

FIG. 4 shows a multiplayer semiconductor device according to a first embodiment of the present invention;

FIGS. 5A and 5B show simulation waveforms showing the influence of a test stub line in the multilayer semiconductor device of the present invention;

FIG. 6 shows a multiplayer semiconductor device according to a second embodiment of the present invention;

DESCRIPTION OF THE PREFERRED EMBODIMENTS

Figure 1:
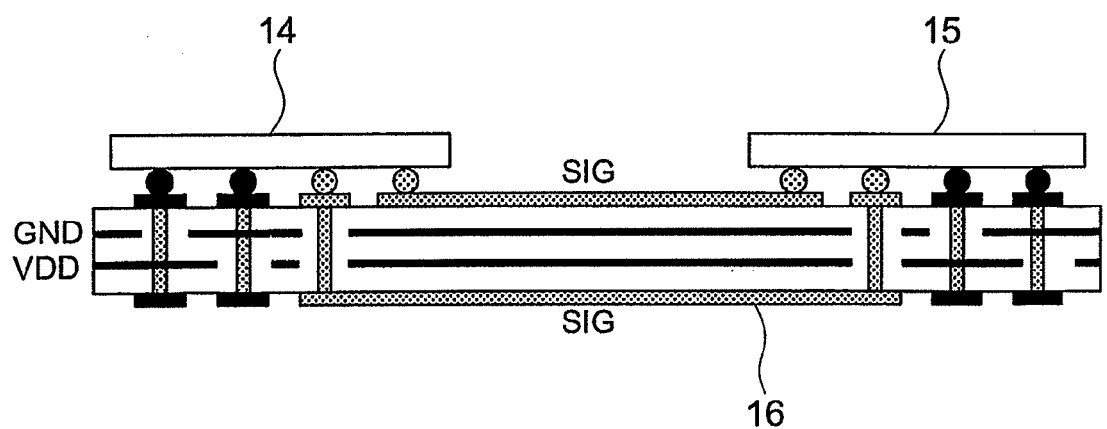
FIG. 1 shows a conventional printed board in which two semiconductor devices are mounted.
Figure 2:
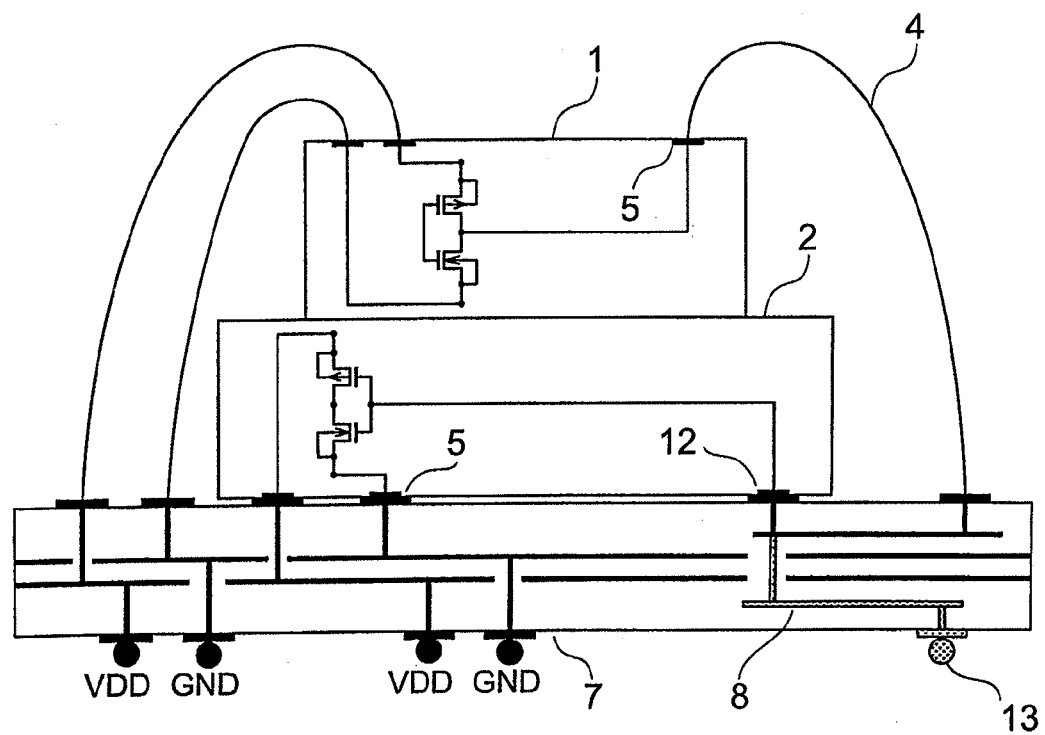
FIG. 2 shows a conventional multilayer semiconductor device in which two kinds of semiconductor chips are layered.

The preferred embodiments of the present invention will now be described with reference to the drawings.

First Embodiment

A first embodiment of the present invention will be described with reference to FIG. 4. FIG. 4 shows the structure of a multilayer semiconductor device according to the first embodiment. In the present embodiment, a switching transistor 3 is used as a device for separating a signal line 6 in the chip from a test stub line 18. The structure of the multilayer semiconductor device according to the first embodiment is as follows.

In the multilayer semiconductor device, an upper layer chip 1 and a lower layer chip 2 are layered on a printed board 7. The lower layer chip 2 includes the switching transistor 3, which is a device for separating the test stub line 18 from the main signal line in the chip. The upper layer chip 1 is connected to the lands of the printed board 7 with bonding wires 4. The multilayer semiconductor device includes a plurality of pads 5 for providing power to and taking signals from the chips. Each chip includes a signal line 6. In addition to the upper layer chip 1 and the lower layer chip 2, pads for connecting the chips, lands, and solder balls serving as external terminals are attached to the printed board 7. For example, the solder balls 9 serve as external terminals of the multilayer semiconductor device. The printed board 7 includes a main signal line 10 connecting the upper layer chip 1 and the lower layer chip 2. The printed board 7 further includes a test signal pin 13 and the test stub line 18 for testing the chips. The lower layer chip 2 includes a test pad 11 and a main signal pad 12.

In the upper layer chip 1 and the lower layer chip 2, signal lines that are not connected to any solder balls (external terminals) are connected to the circuit elements in the chips through a signal line 6 in the upper layer chip 1, a pad 5, a bonding wire 4, the main signal line 10 on the printed board 7, the main signal pad 12, and a signal line 6 in the lower layer chip 2. The test signal pin 13 is connected to the signal line 6 of the lower layer chip 2 through the test stub line 18, the test pad 11, and the switching transistor 3.

Power lines (VDD and GND) are connected to solder balls serving as external terminals through pads or bonding wires. Signal lines that are connected to other solder balls (not shown) serving as external terminals are connected to the solder balls serving as external terminals through pads or bonding wires.

Next, the operation of the present invention will be described with reference to FIG. 4.

The drive of the upper layer chip 1 is connected to the receiver of the lower layer chip 2 through the signal line 6 of the upper layer chip 1, the bonding wire 4, the main signal line 10, and the signal line 6 of the lower layer chip 2. The test stub line 18 is connected to the signal line 6 of the lower layer chip 2 through the switching transistor 3.

During the normal operation, the switching transistor 3 disposed between the signal line 6 and the test stub line 18 is turned off. The test stub line 18 is separated from the signal line 6. The waveform deterioration in the signal line due to the influence of the test stub line 18 is thus prevented.

The tests of the chips in the multilayer semiconductor device include the test for the drive in the upper layer chip 1 and the test for the receiver in the lower layer chip 2.

When the drive side in the upper layer chip 1 is tested, data is input into the upper layer chip 1 through an input terminal (not shown). According to the input data, the drive outputs data. The data output from the drive is sent to the test signal pin 13. In this state, the switching transistor 3 is turned on. No signals are input into the test signal pin 13 connected to the test stub line 18. The signal output from the drive circuit of the upper layer chip 1 is observed with a measuring apparatus such as a semiconductor tester or an oscilloscope, a generator, or an IC that is connected to the multilayer semiconductor device mounted on the printed board. Since no other signals are input into the test stub line 18, there is no need to consider the collision between the signal output from the drive circuit of the upper layer chip 1 and other signals.

When the receiver side in the lower layer chip 2 is tested, a signal is input into the test signal pin 13 from a semiconductor tester, a pattern generator, or an IC that is connected to the multilayer semiconductor device mounted on the printed board. The data output from the lower layer chip 2 through an output terminal (not shown) is checked. At this time, the switching transistor 3 is turned on. No signals are output from the drive circuit of the upper layer chip 1. Therefore, there is no need to consider the collision between the signal output from the drive circuit of the upper layer chip 1 and the signal input into the test signal pin 13.

FIGS. 5A and 5B show simulation waveforms showing the influence of the test stub line 18. The simulation waveforms are waveforms in the main signal pad 12 when a random pattern is generated. FIG. 5A shows a waveform that is generated when the switching transistor 3 is turned on to connect the test stub line 18 to the signal line 6. FIG. 5B shows a waveform that is generated when the switching transistor 3 is turned off to separate the test stub line 18 from the signal line 6. As is clear from the simulation results of FIGS. 5A and 5B, when the test stub line 18 is separated from the signal line 6, the reflection of signals is small and converges in a short time. Separating the test stub line 18 from the signal line 6 enables high-quality and high-speed data communication.

In the first embodiment, in order to enable testing of individual chips, the switching transistor is turned on and connects the test stub line to the signal line. During the normal operation, the switching transistor is turned off to disconnect the test stub line from the signal line. Since the stub line between the layered chips is eliminated, the multilayer semiconductor device can perform high quality and high-speed data communication.

Second Embodiment

Next, a second embodiment of the present invention will be described with reference to FIG. 6.

FIG. 6 shows a multilayer semiconductor device according to the second embodiment of the present invention. The same reference numerals will be used to designate the same components as those in FIG. 4, so that the description will be omitted. In the multilayer semiconductor device, a plurality of semiconductor chips (an upper layer chip 1 and a lower layer chip 2) are layered. In the first embodiment, the lower layer chip 2 includes the switching transistor 3 as a device for separating the test stub line 18 from the signal line 6. In the present embodiment, a lower layer chip 2 includes a selector 20 as a device for separating a test stub line 28 from a signal line 6. The selector 20 can select one signal line from the signal line 6 and other (N−1) signal lines 16 and connect the selected signal line to the test stub line 28. Here, N is a positive integer greater than or equal to 2.

In the present embodiment, a plurality of signal lines are correspondingly connected to a plurality of pads of the upper layer chip 1. The selector 20 selects one signal line from the plurality of signal lines. The selected signal line is connected to the test stub line 28 and a test signal pin 13. The selector 20 selects one signal line from N signal lines. Connecting the N signal lines to the test stub line 28 through the selector 20 can reduce the numbers of the test stub lines and the test signal pins to 1/N. This can prevent the area of the multilayer semiconductor device from increasing or prevent the numbers of power source pins and ground pins allocated to the multilayer semiconductor device from being reduced.

When the upper layer chip 1 is tested, the selector 20 selects one signal line from the N signal lines and connects the selected signal line to the test stub line 28. A signal is input into the upper layer chip 1 through an input pin (not shown). A signal output from the upper layer chip 1 is sent to the test signal pin 13 connected to the test stub line 28. The signal output from the test signal pin 13 is observed with a measuring apparatus such as a semiconductor tester or an oscilloscope, or an IC that is connected to the multilayer semiconductor device mounted on the printed board. This output signal is observed as a signal output from the drive of the upper layer chip 1. Next, the selector 20 selects another (untested) signal line and connects the selected signal line to the test stub line 28. The newly connected signal line is tested. In this way, all signal lines are tested. Since no other signals are input into the test stub line 28, there is no need to consider the collision between the output signal from the drive of the upper layer chip 1 and other signals.

When the lower layer chip 2 is tested, the selector 20 selects one signal line from the N signal lines and connects the selected signal line to the test stub line 28. A signal is input into the lower layer chip 2 through the test signal pin 13 from a semiconductor tester, a pattern generator, or an IC that is connected to the multilayer semiconductor device mounted on the printed board. The lower layer chip 2 is tested through an output terminal (not shown) of the lower layer chip 2. Next, the selector 20 selects another (untested) signal line and connects the selected signal line to the test stub line 28. The newly connected signal line is tested. In this way, all signal lines are tested. With respect to the signals from the upper layer chip 1, no data signals are output from the drive of the upper layer chip 1. Therefore, there is no need to consider the collision between the signal output from the drive and the signal input into the test stub line 28.

In the present embodiment including the selector 20, during the normal operation, the selector 20 does not select any signal line and the test stub line 28 is separated from the signal lines. Therefore, the reflection of signals and the crosstalk attributed to the test stub line 28 do not occur.

For example, it is assumed that a CPU and a memory are layered. In the case where the upper layer chip is the CPU and the lower layer chip is the memory, data transmission between the CPU and the memory is carried out in the multilayer semiconductor device only without outer transmission. Therefore, there is a case that the multilayer semiconductor device has no external terminals. One unit of the data includes 32 bits or 64 bits. If a test signal pin is provided for each bit, the number of test signal pins to be added increases. Due to the increase in the number of test signal pins, the area of the multilayer semiconductor device increases, or the number of power source pins needs to be reduced. However, providing one test signal pin per N signal lines can reduce the number of test signal pins and can solve the problem of the increase in the number of pins.

For example, in the case where 16 test signal pins are provided for 64 bit data lines, first, 16 bits from D0 to D15 are tested. Next, 16 bits from D16 to D31 are tested. Next, 16 bits from D32 to D47 are tested. Finally, 16 bits from D48 to D63 are tested. In this way, the testing of 64 bits from D0 to D63 is completed. In the case where the ratio of signal lines to test signal pins is 1:1, it is necessary to provide 64 test signal pins. In contrast, in the case where the selector 20 is used and the ratio of signal lines to test signal pins is N:1 as in the present embodiment, the number of test signal pins is 16. That is, the number of test signal pins can be reduced by 48 (=64−16).

In the memory, in many cases, input/output (common use for input and output) pins are often used as data terminals. In the case where an input/output pin is used, the input/output pin is controlled by a data control signal so as to function as an input pin or an output pin. Therefore, during writing into the memory, signals are input into the lower layer chip 2 (memory) from the test signal pin. During reading out of the memory, signals are output from the test signal pin. In this case, the upper layer chip 1 is controlled so as not to operate, and the input/output pin of the lower layer chip 2 is independently treated as an input pin during writing and as an output pin during reading. As a result, it is possible to carry out the test.

In the present embodiment, in order to enable testing of the layered chips individually, the selector 20 selects one signal line and connects the selected signal line to the test stub line 28. During the normal operation, the selector 20 disconnects the test stub line 28 from the signal line. Therefore, the multilayer semiconductor device can perform high-quality and high-speed data communication.

In addition, in the present embodiment, the selector 20 selects one signal line from N signal lines and connects the selected signal line to the test stub line 28. Therefore, the number of test stub lines 28 and the number of test signal pins are reduced to 1/N. The area of the multilayer semiconductor device can be prevented from increasing, or the numbers of power source pins and ground pins allocated to the multilayer semiconductor device can be prevented from being reduced. Since the number of slits in the power source layer or the ground layer can be reduced, a more powerful power source/ground can be designed.

Third Embodiment

A third embodiment of the present invention will be described with reference to FIG. 7.

Figure 7:
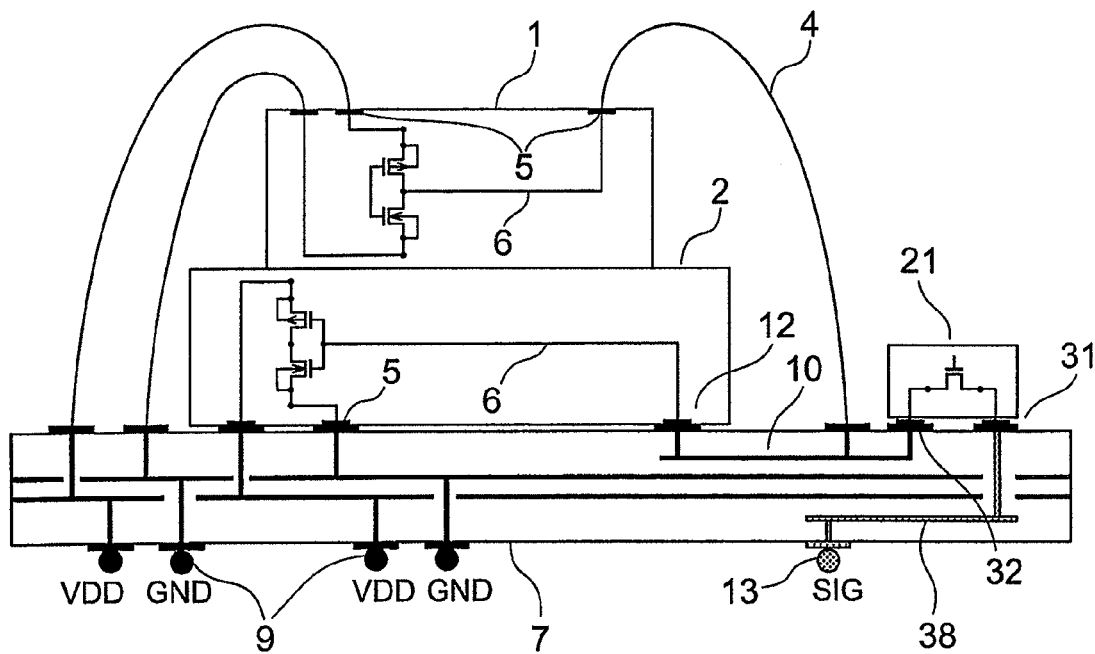
FIG. 7 shows a multiplayer semiconductor device according to a third embodiment of the present invention.

FIG. 7 shows a multilayer semiconductor device according to a third embodiment of the present invention. The same reference numerals will be used to designate the same components as those in FIGS. 4 and 6, so that the description will be omitted. In the multilayer semiconductor device, a plurality of semiconductor chips (an upper layer chip 1 and a lower layer chip 2) are layered.

In the first embodiment shown in FIG. 4, the lower layer chip 2 includes the test pad 11 and the switching transistor 3 serving as a device for separating the test stub line 18 from the main signal line. In the present embodiment, instead, a land 31 for testing and a land 32 for a signal line are provided on a printed board 7. A transistor 21 for external switching is provided between these lands. The lands 31 and 32, and transistor 21 will be called a test land and a signal line land, and an external switching transistor, respectively.

The drive circuit of the upper layer chip 1 is connected to the receiver circuit of the lower layer chip 2 through a signal line 6 in the upper layer chip 1, a pad 5, a bonding wire 4, a main signal line 10 of the printed board 7, a main signal pad 12, and a signal line 6 in the lower layer chip 2. The external switching transistor 21 can connect the main signal line 10 to a test stub line 38 and a test signal pin 13.

In the present embodiment, the test land 31 and the signal line land 32 are provided on the printed board 7. As a device for separating the test stub line 38 from the main signal line, the external switching transistor 21 is provided between the test land 31 and the signal line land 32. The operation of the external switching transistor 21 is the same as that of the switching transistor 3 in the first embodiment, and therefore the detailed description will be omitted.

In the present embodiment, in order to enable testing of individual chips, the external switching transistor 21 is turned on and connects the test stub line 38 to the signal line. During the normal operation, the external switching transistor 21 is turned off to disconnect the test stub line 38 from the signal line. Therefore, the multilayer semiconductor device can perform high-quality and high-speed data communication.

Fourth Embodiment

Next, a fourth embodiment of the present invention will be described with reference to FIG. 8.

Figure 8:
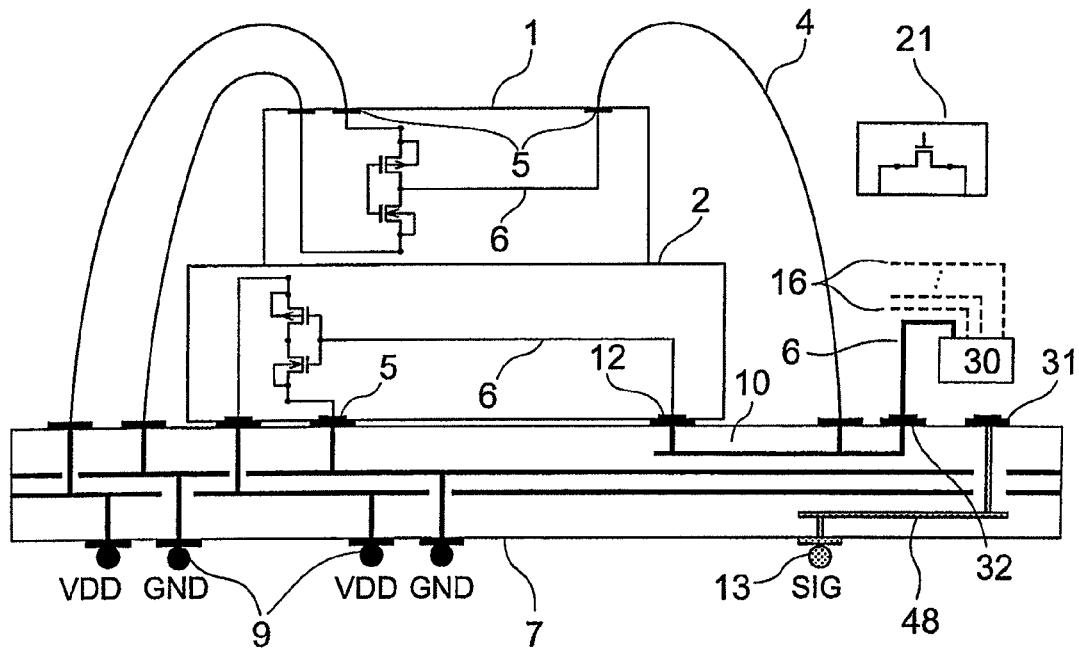
FIG. 8 shows a multiplayer semiconductor device according to a fourth embodiment of the present invention.

FIG. 8 shows a multilayer semiconductor device according to the fourth embodiment of the present invention. The same reference numerals will be used to designate the same components as those in FIGS. 4, 6, and 7, so that the description will be omitted. In the multilayer semiconductor device, a plurality of semiconductor chips (an upper layer chip 1 and a lower layer chip 2) are layered.

In the second embodiment shown in FIG. 6, the lower layer chip 2 includes the selector 20 serving as a device for separating the test stub line 28 from the main signal line. In the present embodiment, an external selector 30 is provided on a printed board 7. The external selector 30 selects one signal line from N signal lines and connects the selected signal line to a test stub line 48.

In the present embodiment, a test land 31 and a signal line land 32 are provided on the printed board 7. As a device for separating the test stub line 48 from the main signal line, the external selector 30 is provided between the test land 31 and the signal line land 32. The operation of the external selector 30 is the same as that of the selector 20 of the second embodiment, and therefore the detailed description will be omitted.

In the present embodiment, in order to enable testing of individual chips, the external selector 30 selects one signal line and connects the selected signal line to the test stub line 48. During the normal operation, the external selector 30 disconnects the test stub line 48 from the signal line. Therefore, the multilayer semiconductor device can perform high-quality and high-speed data communication.

In addition, in the present embodiment, the external selector 30 selects one signal line from N signal lines and connects the selected signal line to the test stub line 48. Therefore, the number of test stub lines 48 and the number of test signal pins are reduced to 1/N. The area of the multilayer semiconductor device can be prevented from increasing, or the numbers of power source pins and ground pins allocated to the multilayer semiconductor device can be prevented from being reduced. Since the number of slits in the power source layer or the ground layer can be reduced, a more powerful power source/ground can be designed.

Fifth Embodiment

Next, a fifth embodiment of the present invention will be described with reference to the drawings.

Figure 9:
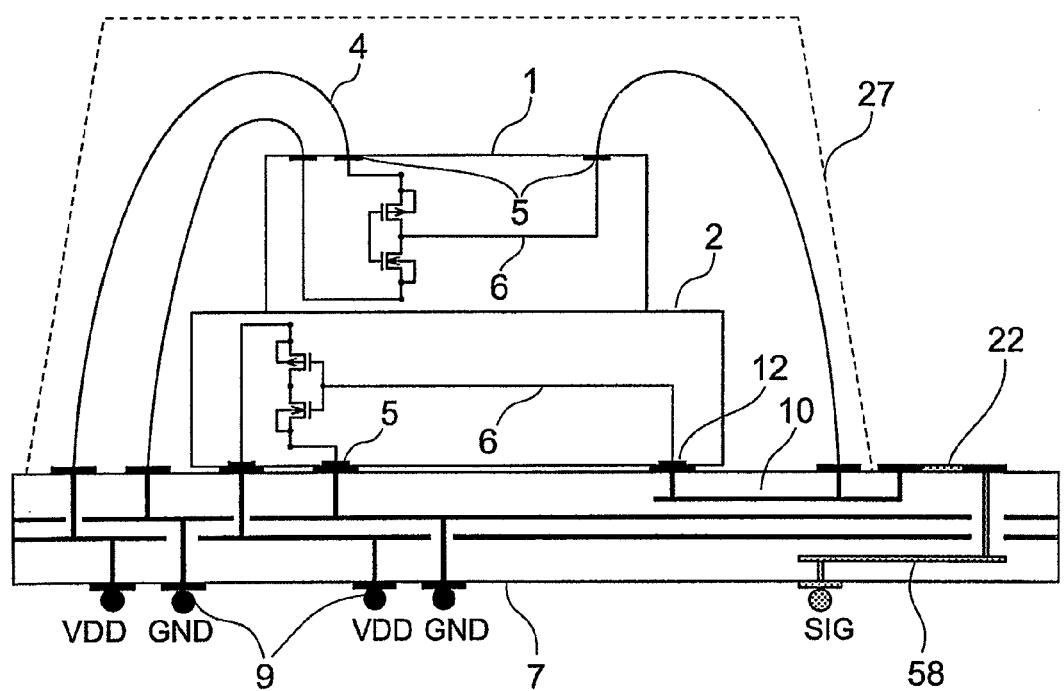
FIG. 9 shows a multiplayer semiconductor device according to a fifth embodiment of the present invention.

FIG. 9 shows a multilayer semiconductor device according to the fifth embodiment of the present invention. The same reference numerals will be used to designate the same components as those in FIG. 4, so that the description will be omitted. The third embodiment shown in FIG. 7 has the external switching transistor 21 serving as a device for separating the test stub line 38 from the main signal line. Instead, the present embodiment has a fuse 22. The fuse 22 separates a test stub line 58 from the signal line. The present embodiment is characterized in that the fuse 22 is disposed outside a mold 27 of the multilayer semiconductor device.

The advantages of the present embodiment are as follows. First, the test stub line 58 is separated from the signal line by just physically cutting the fuse 22 after testing. That is, it is not necessary to form a switching transistor (serving as a device for separating the test stub line from the main signal line) in the layered chips or on the printed board, and therefore the present embodiment can be realized easily and at a low cost. In addition, after the fuse 22 is cut, the signal line near the mold 27 serves as a pad that a probe or the like can touches and therefore can be used for checking the signal waveform in the normal operation.

In the present embodiment, in order to enable testing of individual chips, the fuse 22 connects the test stub line 58 to the signal line. During the normal operation, the fuse 22 is cut to disconnect the test stub line 58 from the signal line. Therefore, the multilayer semiconductor device can perform high-quality and high-speed data communication.

Sixth Embodiment

Next, a sixth embodiment of the present invention will be described with reference to drawings.

Figure 10:
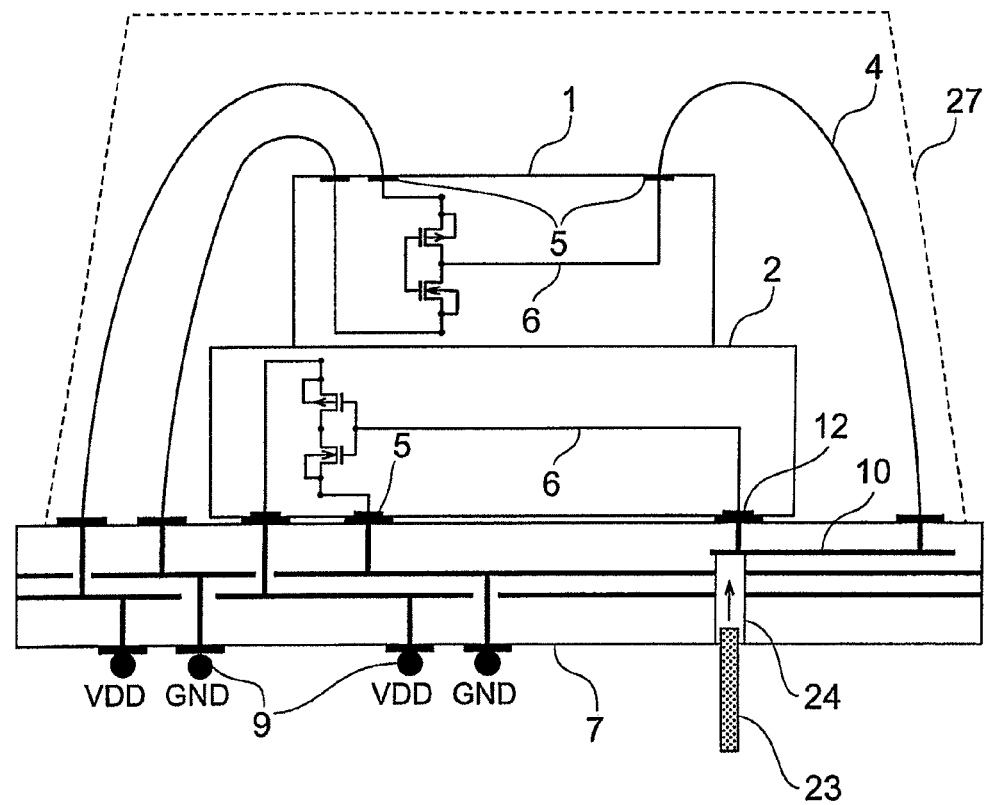
FIG. 10 shows a multiplayer semiconductor device according to a sixth embodiment of the present invention.
Figure 11:
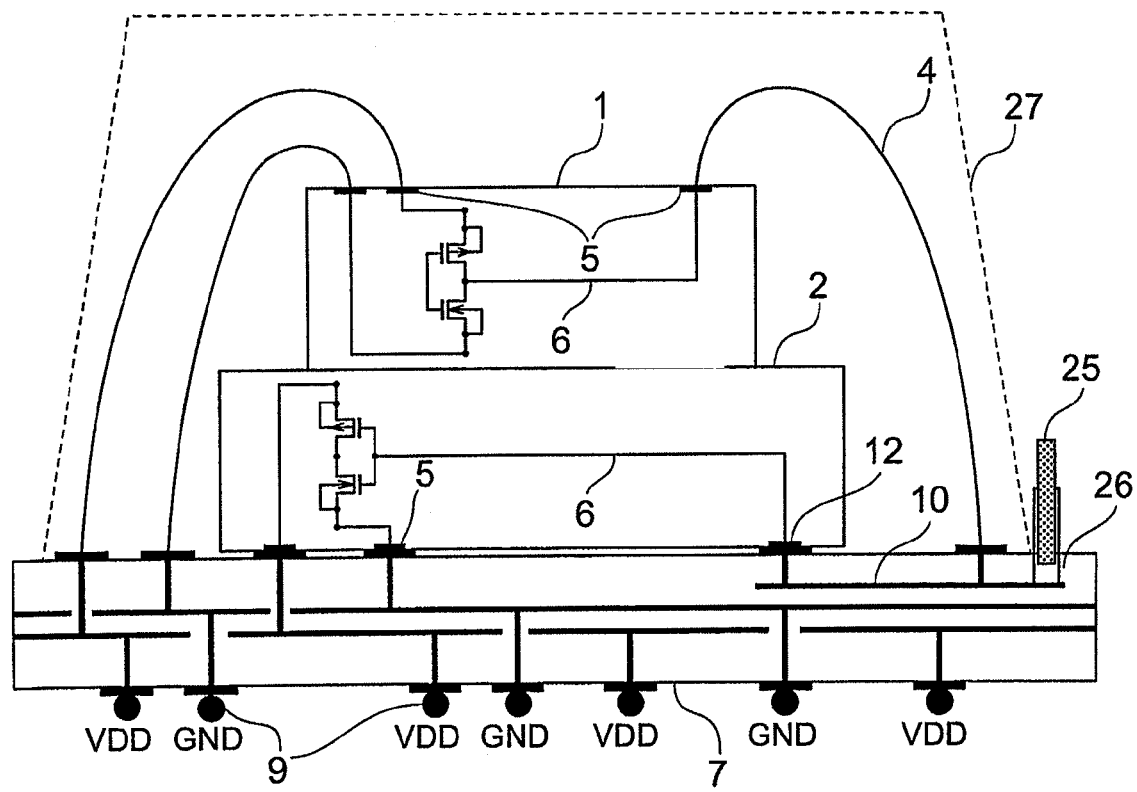
FIG. 11 shows a multiplayer semiconductor device according to a modification of the sixth embodiment of the present invention.

FIGS. 10 and 11 show multilayer semiconductor devices according to the sixth embodiment of the present invention and its modification, respectively. The first to fifth embodiments have devices for separating the test stub line from the main signal line. The present embodiment has no device for separating the test stub line from the main signal line, and has a stubless structure. In the present embodiment, a hole functions as a test terminal when a conductive material is fitted into the hole. The conductive material is, for example, a connector, a probe, or the like.

As shown in FIG. 10, a connector hole 24 is provided in the lower side of a printed board 7. The connector hole 24 reaches a main signal line 10. A connector 23 is inserted into the connector hole 24 so as to connect to the main signal line 10. When the test is carried out, signals are input into the connector 23 from a semiconductor tester, a pattern generator, or an IC that is connected to the multilayer semiconductor device mounted on the printed board, or signals are output through the connector 23. During the normal operation, the connector 23 is not inserted. Therefore, signals are not deteriorated by the test stub line.

As shown in FIG. 11, a probe hole 26 is provided in the upper side of a printed board 7. The probe hole 26 reaches a main signal line 10. A probe 25 is inserted into the probe hole 26 so as to connect to the main signal line 10. When the test is carried out, signals are input into the probe 25 from a semiconductor tester, a pattern generator, or an IC that is connected to the multilayer semiconductor device mounted on the printed board, or signals are output through the probe 25. During the normal operation, the probe 25 is not inserted. Therefore, signals are not deteriorated by the test stub line.

In the present embodiment, in order to enable testing of individual chips, the connector or the probe connects the test stub line to the signal line. During the normal operation, the connector or the probe is not inserted, and therefore the test stub line does not exist. Since there is no stub line of signal line between the layered chips, the multilayer semiconductor device can perform high-quality and high-speed data communication.

Seventh Embodiment

Next, a seventh embodiment of the present invention will be described.

In the multilayer semiconductor devices of the first to sixth embodiments, two semiconductor chips are layered and connected to each other. However, in the present invention, the number of the layered semiconductor chips is not limited to two. If necessary, any number of semiconductor chips may be layered.

The bonding wire technique is used to connect the semiconductor chips to the printed board. Instead of using the wire bonding, semiconductor chips having through-electrodes may be layered. The present invention can be applied to a multilayer semiconductor device in which semiconductor chips are layered using other wiring techniques.

In the seventh embodiment, in order to enable testing of individual chips, the test stub line is connected to the signal line with a switching transistor, a selector, a fuse, a connector or a probe. During the normal operation, the test stub line is separated from the signal line. Since there is no stub line of signal line between the layered chips, the multilayer semiconductor device can perform high-quality and high-speed data communication.

Eighth Embodiment

Next, an eighth embodiment of the present invention will be described.

In the first to seventh embodiments, simple chips or semiconductor devices are layered. In the eighth embodiment, chips having a plurality of functions, for example, SOCs (System On Chips) are layered. The SOC is that a CPU, a controller, a memory, and so on are integrated.

In the eighth embodiment, in order to enable testing of individual chips, the test stub line is connected to the signal line with a switching transistor, a selector, a fuse, a connector or a probe. During the normal operation, the test stub line is separated from the signal line. Since there is no stub line of signal line between the layered chips, the multilayer semiconductor device can perform high-quality and high-speed data communication.

Ninth Embodiment

Next, a ninth embodiment of the present invention will be described.

In the first to eighth embodiments, simple chips are layered. However, the present invention is not limited to layered simple chips. In the ninth embodiment, a plurality of packaged semiconductor devices are layered.

In the ninth embodiment, in order to enable testing of individual semiconductor devices, the test stub line is connected to the signal line with a switching transistor, a selector, a fuse, a connector or a probe. During the normal operation, the test stub line is separated from the signal line. Since there is no stub line of signal line between the layered semiconductor devices, the multilayer semiconductor device can perform high-quality and high-speed data communication.

As described above, the multilayer semiconductor devices according to the present invention have an element for separating a test stub line (provided for testing each semiconductor chip in the multilayer semiconductor device) from the main signal line. Separating the test stub line from the signal line by means of this separating element during the normal operation can improve the signal quality in the normal operation.

Using a selector as the separating element and connecting a plurality of signal lines to the selector can reduce the number of the test stub lines. The area of the multilayer semiconductor device can be prevented from increasing, or the numbers of power source pins and ground pins allocated to the multilayer semiconductor device can be prevented from being reduced. Since the number of slits in the power source layer or the ground layer can be reduced, a more powerful power source/ground can be designed.

It is to be understood that the present invention is not intended to be limited to the above-described embodiments, and various changes may be made therein without departing from the spirit of the present invention.

What is claimed is:

1. A semiconductor device comprising:
   a first chip including a first signal line;
   a second chip including a second signal line;
   an internal line electrically connecting the first signal line with the second signal line; and
   a printed board including a test portion for testing an electrical condition of the internal line, the test portion electrically connecting the internal line with a test external terminal when the semiconductor device is subject to a test mode in which each of the first and second signal lines is tested and the test portion electrically disconnecting the internal line from the test external terminal during a normal operation of the semiconductor device.

2. The semiconductor device according to claim 1, wherein a part of the internal line is mounted in the printed board.

3. The semiconductor device according to claim 1, wherein the internal line is not connected to any external terminals during the normal operation.

4. The semiconductor device according to claim 1, wherein the first chip includes a third signal line, the second chip includes a fourth signal line, and the printed board includes first and second external terminals, the first and second external terminal connecting electrically with the third and fourth signal lines, respectively.

5. The semiconductor device according to claim 1, wherein the test portion is an insert hole which reaches the internal line, and a conductive member is inserted into the insert hole to connect the internal line to an external measuring apparatus when the semiconductor device is subject to the test mode.

6. The semiconductor device according to claim 5, wherein the conductive member is a connector or a probe.

7. The semiconductor device according to claim 1, wherein the semiconductor device is a multilayer semiconductor device, and the first chip is disposed on a top surface of the second chip.

* * * * *